United States Patent [19]

Ueda

[11] Patent Number: 5,083,191

[45] Date of Patent: Jan. 21, 1992

[54] SEMICONDUCTOR DEVICE

[75] Inventor: Tetsuya Ueda, Itami, Japan

[73] Assignee: Mitsubishi Denki Kabushiki Kaisha, Japan

[21] Appl. No.: 442,708

[22] Filed: Nov. 28, 1989

[30] Foreign Application Priority Data

Aug. 15, 1989 [JP] Japan .................................. 1-209578

[51] Int. Cl.$^5$ ............................................. H01L 23/48
[52] U.S. Cl. ........................................ 357/68; 357/71; 357/74
[58] Field of Search ............................. 357/68, 71, 74

[56] References Cited

U.S. PATENT DOCUMENTS 4,701,781 10/1987 Sankhagowit ......................... 357/74
4,772,936 9/1988 Reding et al. ......................... 357/74

Primary Examiner—Paul Gensler
Assistant Examiner—R. Ratliff
Attorney, Agent, or Firm—Leydig, Voit & Mayer

[57] ABSTRACT

A semiconductor device includes an insulating film having an opening and first and second surfaces, a semiconductor chip positioned inside the opening and having first and second surfaces and a plurality of electrodes formed on its first surface, a plurality of leads supported on the first surface of the insulation film and connected to the electrodes of the semiconductor chip, first and second protective films facing the first and second surfaces of the insulating film, respectively, and a bonding agent disposed between the first and second protective films sealing the semiconductor chip and bonding the films together.

10 Claims, 11 Drawing Sheets

SEMICONDUCTOR DEVICE

BACKGROUND OF THE INVENTION

1. Field of the Invention

This invention relates to a semiconductor device constructed by mounting a semiconductor chip on a carrier tape by the TAB (tape automated bonding) method and to a method of manufacturing this type of semiconductor device.

2. Description of the Related Art

FIGS. 16A and 16B respectively show in plan and in section the structure of a carrier tape on which a semiconductor chip is mounted. The carrier tape has a film 1 formed of an insulating material such as polyimide. A plurality of perforation holes 6 are formed at equal intervals along each edge of the film 1, and a rectangular center device hole 3 in which a semiconductor chip 2 is placed is formed centrally between the edges of the film 1. A plurality of outer lead holes 5 are formed around the center device hole 3. A plurality of leads 4 formed from copper are fixed on the film 1. The leads 4 are supported on a support portion 7 formed between the center device hole 3 and the outer lead holes 5 in such a manner that their extreme end portions extend as inner leads 4a over the center device hole 3 while their central portions are located on the outer lead holes 5 as outer lead 4b to be connected to an external circuit. A test pad 4c is formed at the distal end of each lead 4. The support portion 7 is connected to the major portion of the film 1 by bridge portions 8 positioned between the adjacent outer lead holes 5.

As shown in FIG. 16B, bump electrodes 21 of the semiconductor chip 2 are connected to the inner leads 4a of the leads 4 inside the center device hole 3 of the carrier tape. The carrier tape and the semiconductor chip 2 constitutes a tape carrier.

The thus-constructed tape carrier is embedded in a resin package or the like to protect the semiconductor chip 2 and the leads 4 against external forces and the environment. For example, as shown in FIG. 17A, the tape carrier is set between an upper mold part 10a and a lower mold part 10b. At this time, the tape carrier is positioned so that the semiconductor chip 2 is accommodated inside a cavity half 12b of the lower mold part 10b. The upper mold part 10a and the lower mold part 10b are thereafter clamped, and a resin 11 is injected into the cavity defined by a cavity half 12a of the upper mold part 10a and the cavity half 12a of the lower mold part 10b. After setting of the resin 11, a molded piece such as that shown in FIG. 17B is removed form the upper mold part 10b and the lower mold part 10b. The leads 4 are thereafter cut between the outer leads 4b and the test pads 4c together with the bridge portions 8 of the film 1, thereby forming the semiconductor device.

However, since the semiconductor chip 2 is supported by the thin leads 4 alone at the time of resin molding, the semiconductor chip 2 may shift from the correct position in response to the resin injecting pressure. In consequence, there is a risk of part or the whole of the lower surface of the semiconductor chip 2 being exposed as shown in FIGS. 18A and 18B or a risk of the semiconductor chip 2 being inclined in the resin 11 as shown in FIG. 18C, defects which cannot be found before the molded piece is removed from the mold. Such a shift from the correct position increases the possibility of permeation of water from the outside into the package and reduces the mechanical strength of the package against external forces, resulting in a deterioration in the reliability of the semiconductor device.

If the thickness of each of layers of resin 11 formed over and under the semiconductor chip 2 is increased in order to prevent this defect, the advantages of the TAB method that resides in a reduction in the overall thickness is not effectively utilized.

SUMMARY OF THE INVENTION

In view of this problem, an object of the present invention to provide a semiconductor device reduced in overall thickness while improved in reliability and a method of manufacturing this semiconductor device.

To this end, the present invention provides a semiconductor device comprising an insulating film having an opening and first and second surfaces facing in opposite directions; a semiconductor chip positioned inside the opening of the insulating film, the semiconductor chip having first and second surfaces parallel to the insulation film and facing in opposite directions and a plurality of electrodes disposed on its first surface; a plurality of leads supported on the first surface of the insulating film, each of the leads having one end connected to a corresponding electrode of the semiconductor chip and the other end extending beyond the insulating film; first and second protective films disposed facing the first and second surfaces of the insulation film, respectively; and a bonding agent disposed between the first and second protective films and the insulting film to seal the semiconductor chip and to bond the first and second protective films to the insulating film.

The present invention also provides a method of manufacturing a semiconductor device comprising the steps of preparing a carrier tape formed of an insulation film and a plurality of leads, the insulating film having first and second surfaces facing in opposite directions, an opening, a plurality of outer lead holes formed around the opening, and a lead support portion positioned between the opening and the outer lead holes, the leads being supported on the first surface of the insulating film and on the lead support portion of the same, one end of each of the leads projecting over the opening; positioning, in the opening of the carrier tape, a semiconductor chip having first and second surfaces facing in opposite directions and a plurality of electrodes disposed on its first surface; electrically connecting one end of each of the plurality of leads to a corresponding electrode of the semiconductor device; applying a bonding agent to a surface of a first protective film and the first surface of the insulating film and the semiconductor chip; applying the bonding agent to a surface of a second protective film and the second surface of the insulating film and the semiconductor chip; and pressing the surface of the first protective film and the surface of the second protective film against the first surface and the second surface of the insulating film, respectively, during setting of the bonding agent so that the semiconductor chip and the plurality of leads are sealed with the bonding agent.

DESCRIPTION OF THE PREFERRED EMBODIMENTS

Embodiments of the present invention will be described below with reference to the accompanying drawings.

Figure 1:
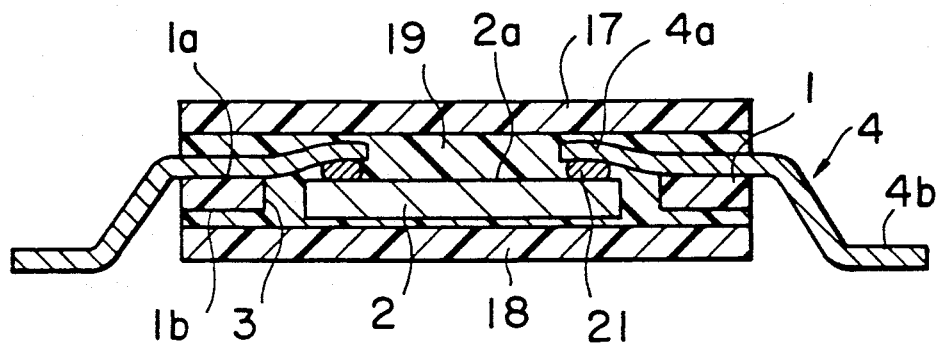
FIG. 1 is a cross-sectional view of a semiconductor device in accordance with a first embodiment of the present invention.

Referring to FIG. 1, a semiconductor device in accordance with the present invention is provided with an insulating film 1 formed of an insulating material such as polyimide. A center device hole 3 in the form of a rectangular aperture is formed in a central portion of the insulating film 1, and a semiconductor chip 2 is placed in the center device hole 3. A plurality of leads 4 formed from copper are fixed on the upper surface 1a of the insulating film 1. Extreme end portions of the leads 4 extend as inner leads 4a over the center device hole 3 while distal ends of the leads 4 extend as outer leads 4b to the outside of the insulating film 1. A plurality of bump electrodes 21 are formed on an upper surface 2a of the semiconductor chip 2 and are connected to the inner leads 4a 4.

First and second protective films 17 and 18 are disposed facing an upper surface 1a and a lower surface 1b of the insulating film 1, respectively. The space between the protective films 17 and 18 and insulating film 1 is filled with a bonding agent 19. The semiconductor chip 2 and the inner leads 4a are sealed in the bonding agent 19.

Figure 2:
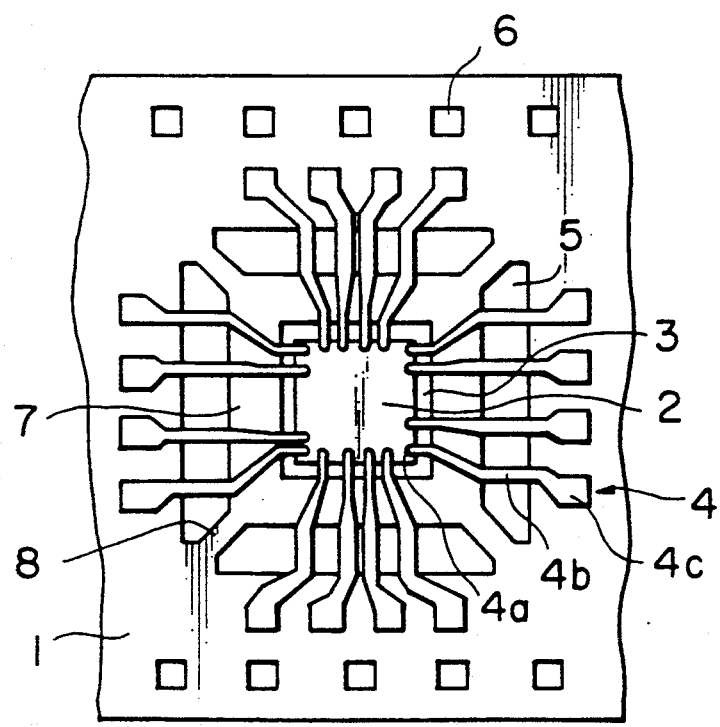
FIGS. 2 and 3 are plan views of a tape carrier and first and second protective films used for the manufacture of the semiconductor device in accordance with the first embodiment.

This semiconductor device can be manufactured as described below. First, the semiconductor chip 2 is mounted on a carrier tape, as shown in FIG. 2. The carrier tape is formed from an insulating film 1 formed of an insulating material such as polyimide with a plurality of copper leads 4 fixed on the insulation film 1. A plurality of perforation holes 6 are formed at equal intervals at each edge of the film 1, and a rectangular center device hole 3 in which the semiconductor chip 2 is placed is formed centrally between the edges of the film 1. A plurality of outer lead holes 5 are formed around the center device hole 3. The leads 4 are supported on a support portion 7 formed between the center device hole 3 and the outer lead holes 5 with their extreme end portions extending as inner leads 4a over the center device hole 3 while their central portions are located on the outer lead holes 5 to be used as outer leads 4b to be connected to electrodes of an external circuit. A test pad 4c is formed at the distal end of each lead 4. The support portion 7 is connected to the major portion of the film by bridge portions 8 positioned between the adjacent outer lead holes 5.

A plurality of bump electrodes are formed from gold or solder on the upper surface of the semiconductor chip 2. The bump electrodes and the inner leads 4a are bonded together by heating and pressing after the semiconductor chip 2 has been introduced into the center device hole 3 so that the bump electrodes and the inner leads of the corresponding leads 4 coincide with each other, thus forming the tape carrier.

Figure 3:
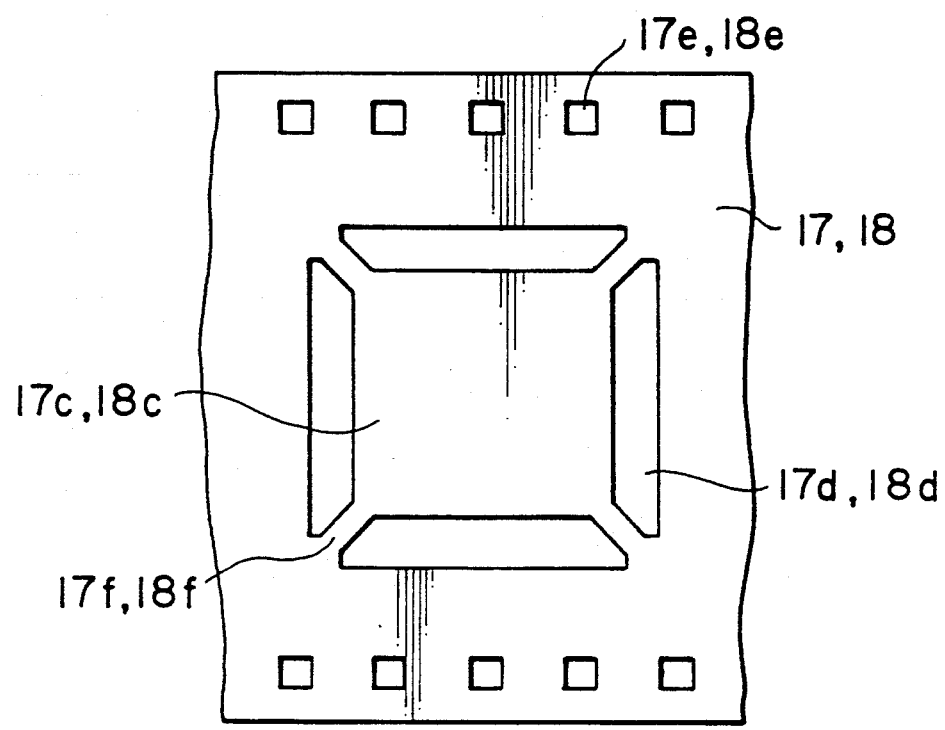

Then, first and second protective films 17 and 18 are prepared which are formed from polyimide, which have the same width as the insulating film 1 of the tape carrier and perforation holes 17e, 18e and outer lead holes 17d, 18d having the same size and formed in the same positions as the perforation holes 6 and the outer lead holes 5 of the insulation film 1, as shown in FIG. 3. However, each of the protective films 17 and 18 has no opening corresponding to the center device hole 3 in its central portion 17c, 18c surrounded by the outer lead holes 17d, 18d and supported by bridge portions 17f, 18f.

Figure 4:
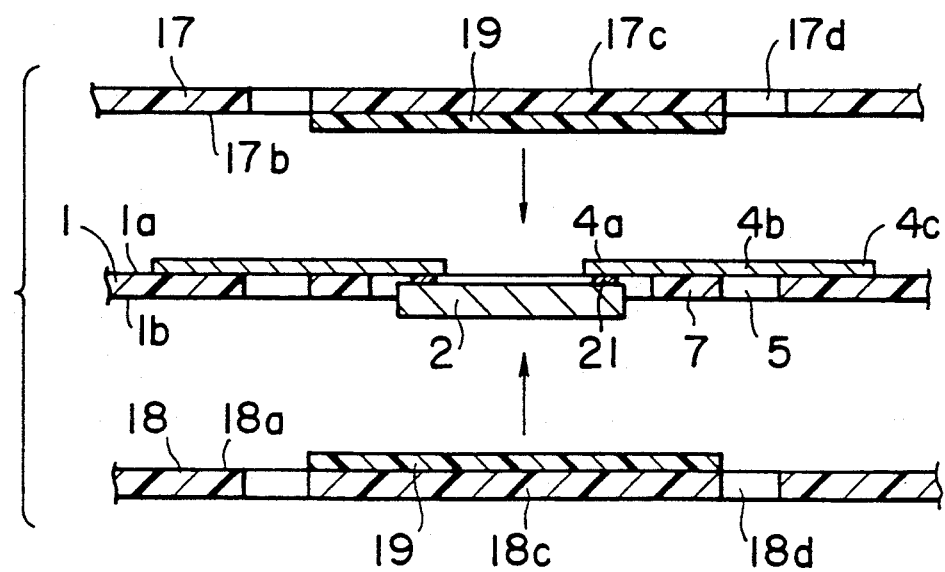
FIGS. 4 to 6 are cross-sectional views of steps of a method of manufacturing the semiconductor device in accordance with the first embodiment.
Figure 5:
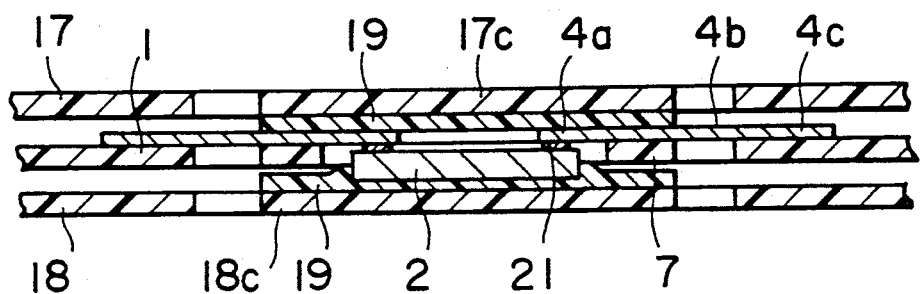
Figure 6:
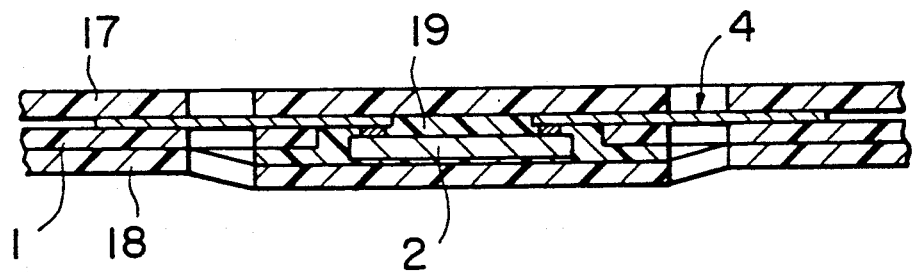

Next, as shown in FIG. 4, a bonding agent 19, such as an epoxy resin, is applied to the whole of the lower surface of the central portion 17c of the first protective film 17 and to the whole of the upper surface of the central portion 18c of the second protective film 18. The protective films 17 and 18 and the tape carrier are then positioned so that the lower surface 17b of the first protective film 17 faces the upper surface 1a of the insulating film 1 while the upper surface 18a of the second protective film 18 faces the lower surface 1b of the insulating film 1. Thereafter, the tape carrier is interposed between the first and second protective films 17 and 18, as shown in FIG. 5, and the protective films 17 and 18 are pressed against each other, as shown in FIG. 6. The bonding agent 19 thereby spreads around the semiconductor chip 2 so that the space between the first and second protective films 17 and 18 is filled with the bonding agent 19.

Figure 7:
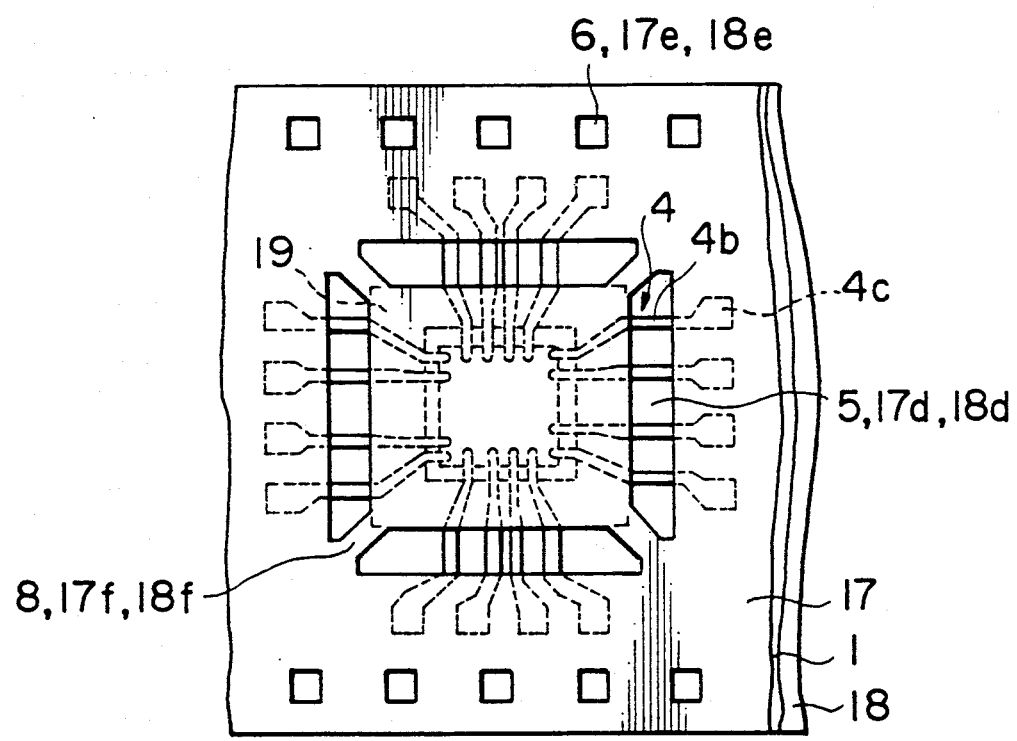
FIG. 7 is a plan view of the assembly of FIG. 6.

FIG. 7 is a plan view of the tape carrier after the protective films 17 and 18 have been applied. After the bonding agent 19 has set in this state, the leads 4 are cut between the outer leads 4b and the test pads 4c together with the bridge portions 8 of the insulating film 1 and the bridge portions 17f and 18f of the protective films 17 and 18. A semiconductor device such as that shown in FIG. 1 is thus manufactured.

As described above, the semiconductor chip 2 is sealed by being interposed between the protective films 17 and 18 to which the bonding agent 19 has been applied. The risk of occurrence of a positional shift is therefore very small, and the reliability of the semiconductor device is improved. In addition, each of the first and second protective films 17 and 18 has the same width as the insulating film 1 of the tape carrier and has the perforation holes 17e or 18e formed at the same position as those of the insulation film 1, thereby facilitating the automation in the manufacture of semiconductor devices.

Figure 8A:
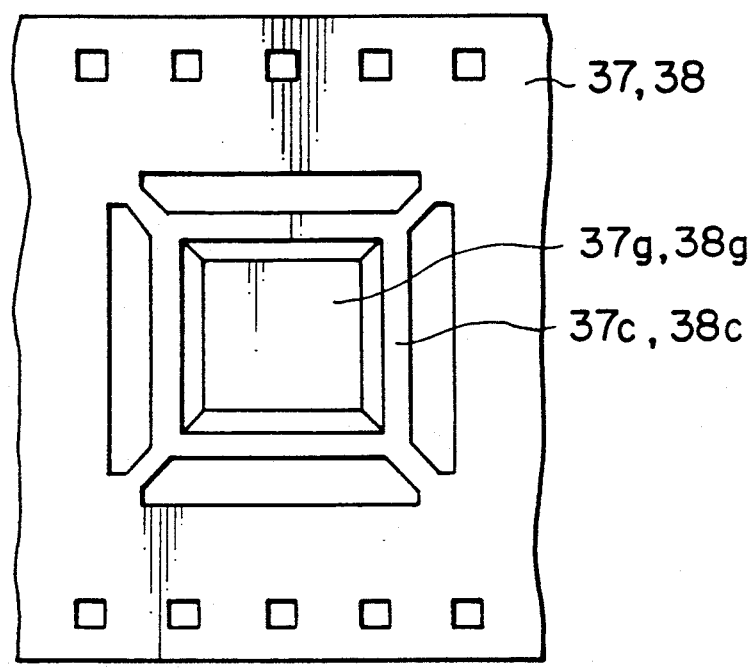
FIGS. 8A and 8B are a plan view and a cross-sectional view of first and second protective films used for the manufacture of a semiconductor device in accordance with a second embodiment of the present invention.
Figure 8B:
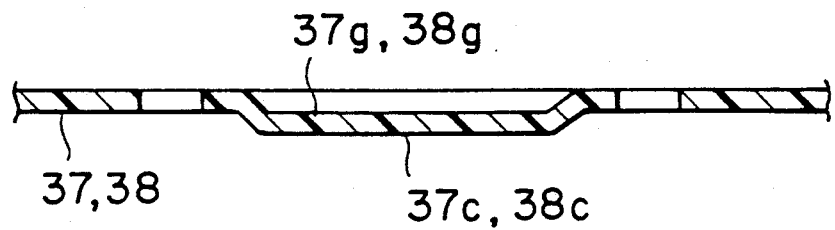
Figure 9:
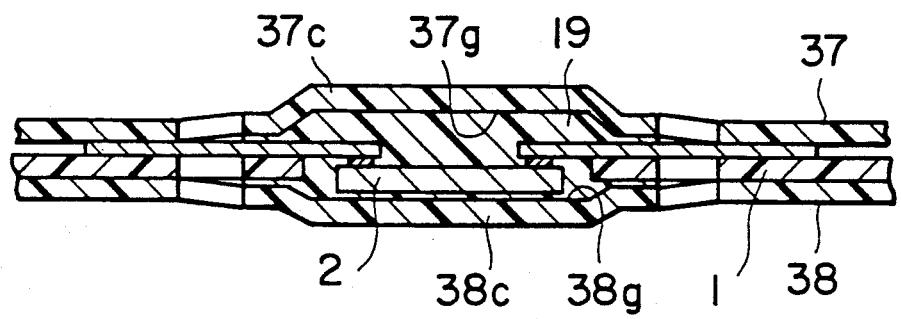
FIG. 9 is a cross-sectional view of a process of manufacturing the semiconductor device in accordance with the second embodiment.

FIGS. 8A and 8B show first and second protective films 37 and 38 for use in a semiconductor device which represents a second embodiment of the present invention. Recesses 37g and 38g are formed in central portions 37c and 38c of the first and second protective films 37 and 38, respectively. If the semiconductor chip 2 is sealed using the protective films 37 and 38 as shown in FIG. 9, the distance between the semiconductor chip 2 and each of the protective films 37 and 38 and, hence, the thickness of the mass of bonding agent 19 is increased and the reliability with respect to external forces and the protection against permeation of water is further improved.

Figure 10:
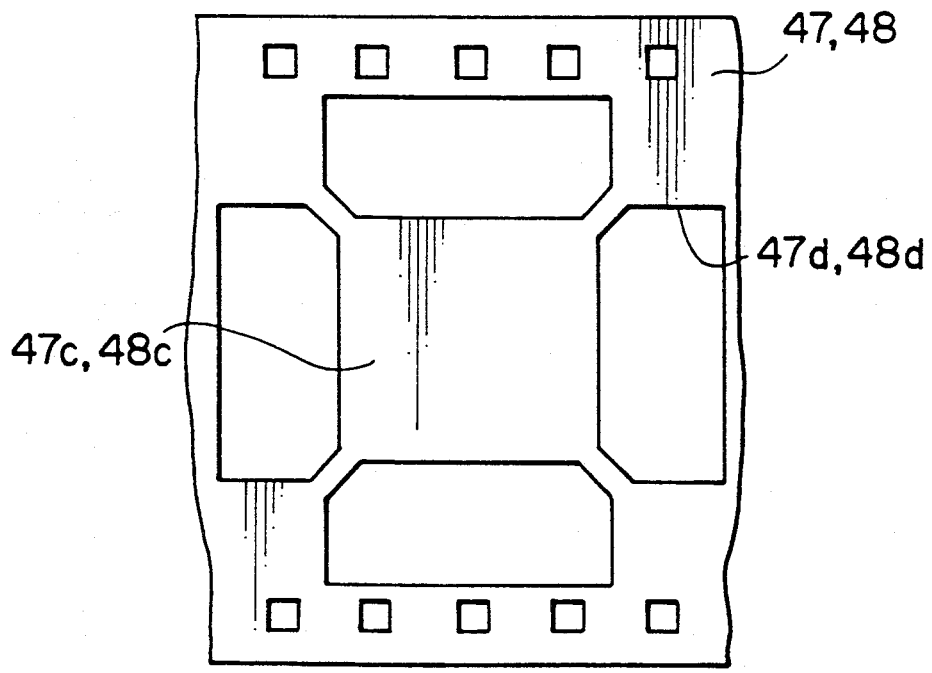
FIG. 10 is a plan view of first and second protective films used for the manufacture of a semiconductor device in accordance with a third embodiment of the present invention.
Figure 11:
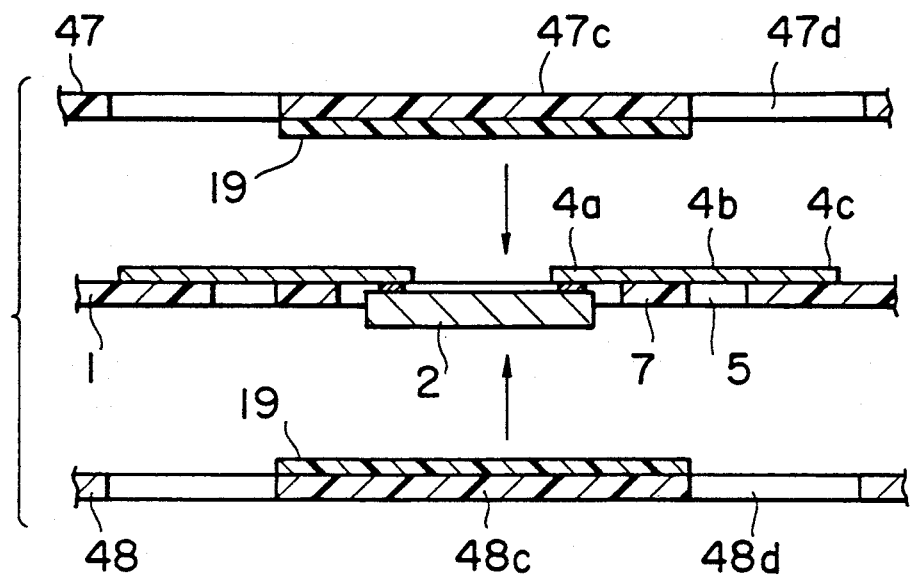
FIGS. 11 and 12 are a cross-sectional view and a plan view of steps of a method of manufacturing the semiconductor device in accordance with the third embodiment.
Figure 12:
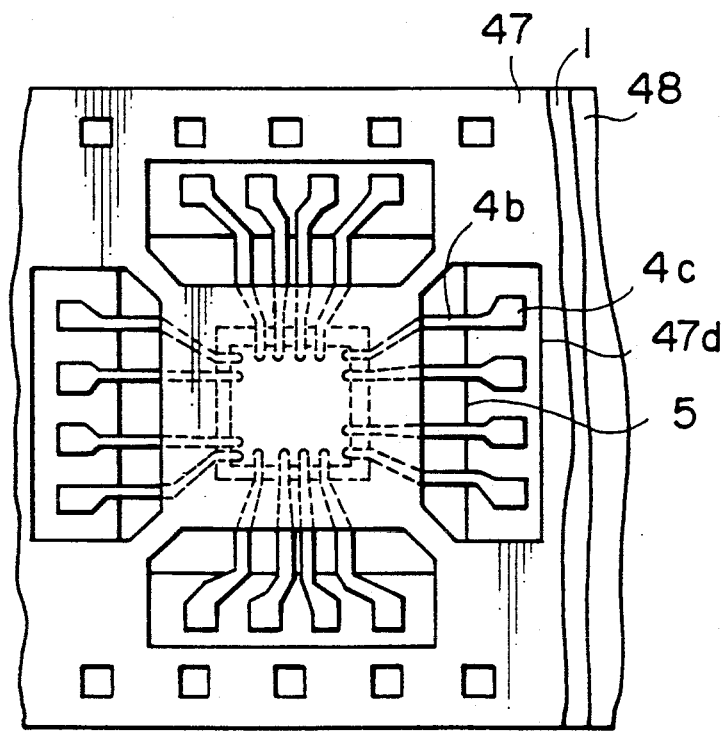

FIG. 10 shows first and second protective films 47 and 48 for use in a semiconductor device which represents a third embodiment of the present invention. Each of a plurality of outer lead holes 47d and 48d is extended in the direction opposite to central portions 47 and 48c, respectively, so that its size is larger than the corresponding outer lead hole 5 of the insulation film 1 of the tape carrier. The test pads 4c of the leads 4 are therefore exposed to the outside through the outer lead holes 47d of the first protective film 47, as shown in FIG. 12. In sealing of the semiconductor chip 2 as shown in FIG. 11 the bonding agent 19 is applied to the whole of the lower surface of the central portion 47c of the first protective film 47 and to the whole of the upper surface of the central portion 48c of the second protective film 48, and the tape carrier is interposed between the protective films 47 and 48. In consequence, the sealed semiconductor device can be easily tested by connecting the probe of a tester (not shown) to each of the exposed test pads 4c.

Figure 13:
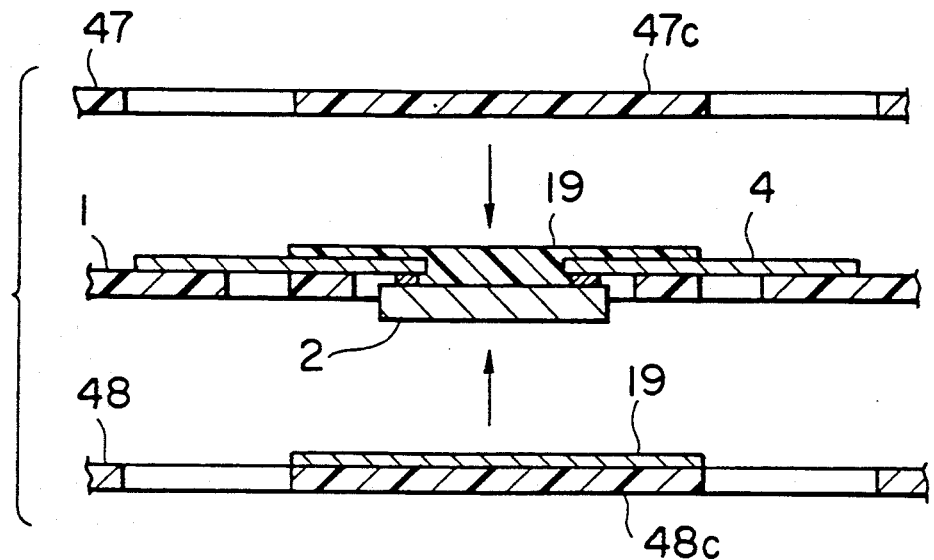
FIGS. 13 to 15 are cross-sectional views of steps of a method of manufacturing a semiconductor device in accordance with a fourth embodiment of the present invention.
Figure 14:
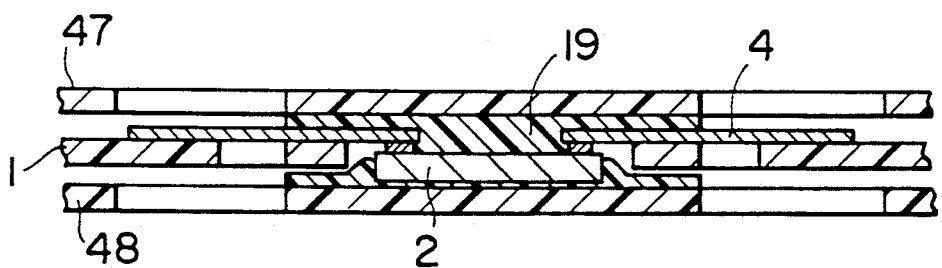
Figure 15:
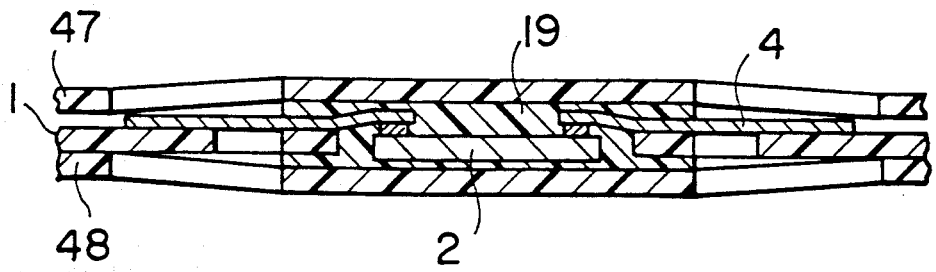
Figure 16A:
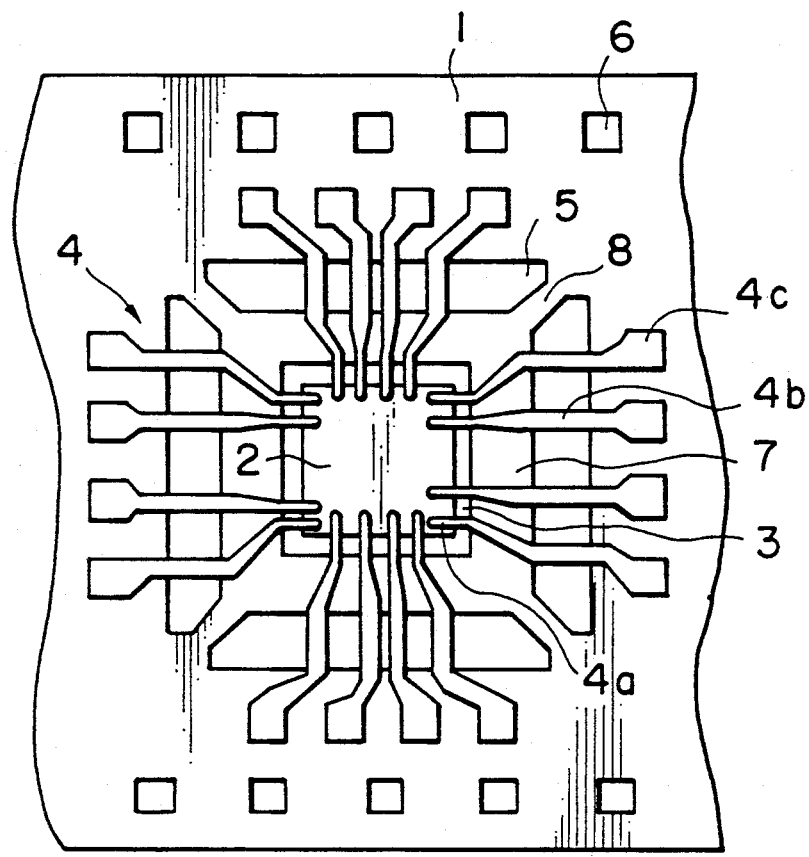
FIGS. 16A and 16B are a plan view and a cross-sectional view of a tape carrier used for a conventional semiconductor device.
Figure 16B:
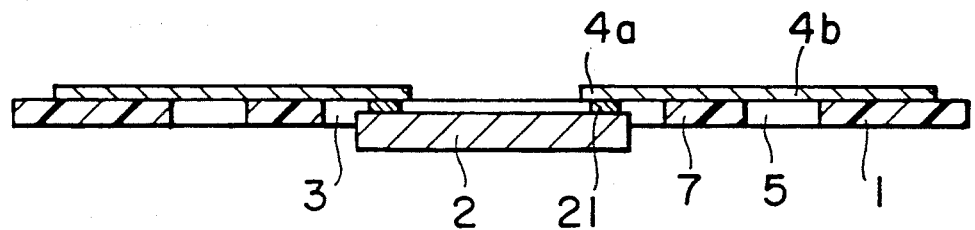
Figure 17A:
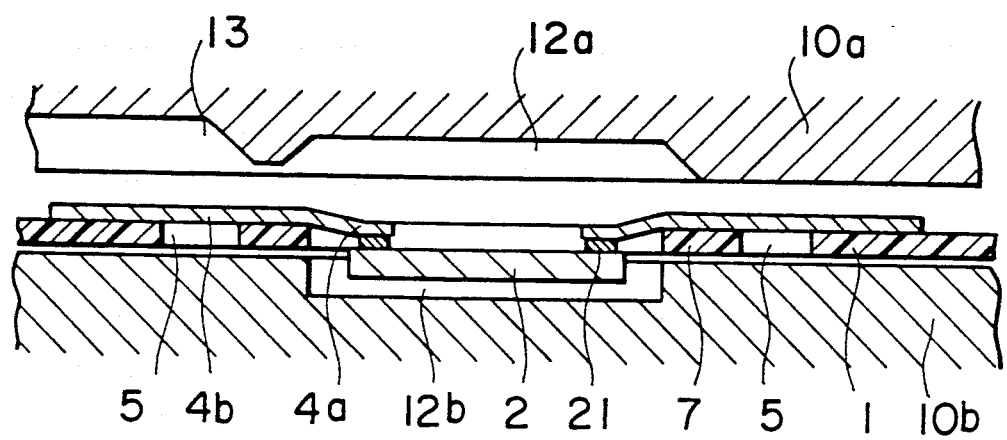
FIGS. 17A and 17B are cross-sectional views of a process of manufacturing a conventional semiconductor device.
Figure 17B:
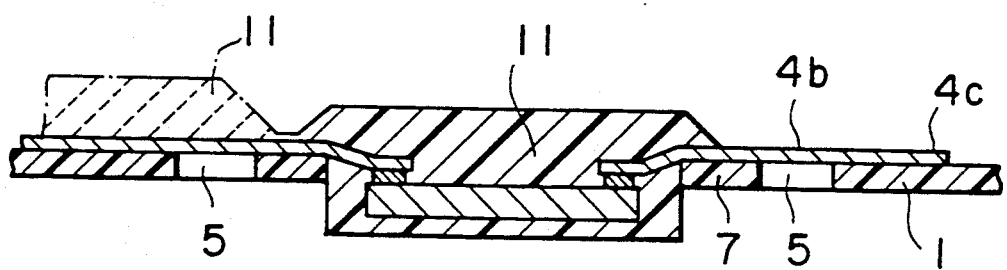
Figure 18A:
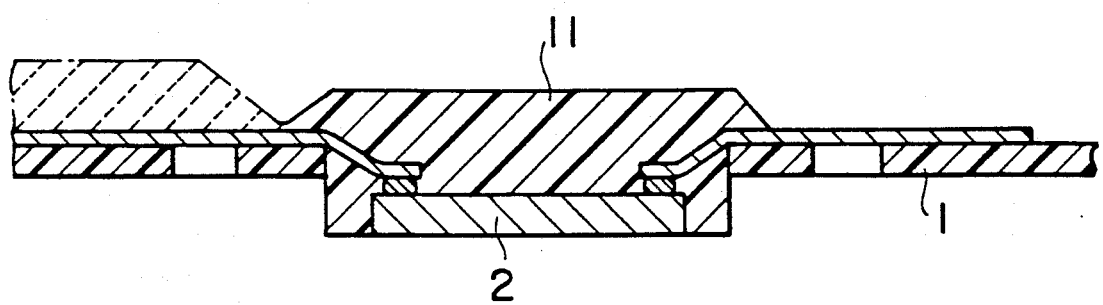
FIGS. 18A to 18C are cross-sectional views illustrating problems of a conventional semiconductor device.
Figure 18B:
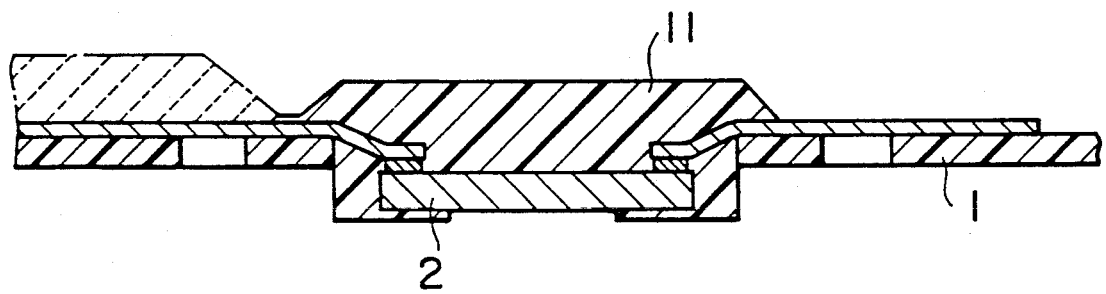
Figure 18C:
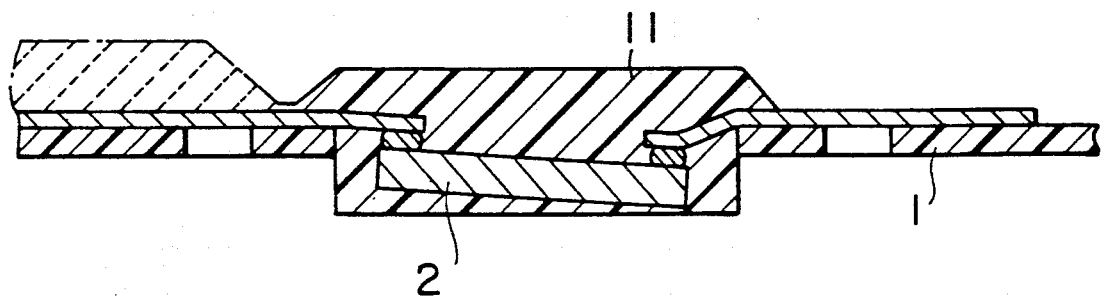

FIGS. 13 to 15 show a manufacturing process according to fourth embodiment of the present invention. In this embodiment, the bonding agent 19 is applied to upper surfaces of the semiconductor chip 2, the leads 4, and the insulation film 1, as shown in FIG. 13, instead of being applied to the lower surface of the central portion 47c of the first protective film 47. The tape carrier is then interposed between the first and second protective films 47 and 48, as shown in FIG. 14, and the protective films 47 and 48 are pressed against each other, as shown in FIG. 15, thereby sealing the semiconductor chip 2. In this process, the risk of formation of voids around the semiconductor chip 2 at the time of sealing is small because the bonding agent 19 is previously applied on the semiconductor chip 2, thereby further improving the reliability of the semiconductor device against the permeation of water and the like. In the example illustrated in FIG. 13, the bonding agent 19 is applied on the central portion 48c of the second protective film 48. However, the bonding agent 19 can be applied to the lower surface of the tape carrier instead of the second protective film 48. Also, the bonding agent 19 may be applied to both the lower surface of the first protective film 47 and the upper surface of the tape carrier and to both the upper surface of the second protective film 48 and the lower surface of the tape carrier.

The material of the first and second protective films 17, 18, 37, 38, 47, and 48 of the described embodiments is not limited to polyimide; flexible insulating material such as epoxy resin impregnated glass fiber or Teflon may be used. If a sheet of a ceramic such as AlN or SiC, or a flexible insulating film coated with a ceramic or a metallic film is used as the protective films, the heat sinking properties of the semiconductor device can be improved. Specifically, if conductive films formed of a metal such as Cu or Al or films formed of a conductive polymer are used as the second protective films 18, 38, and 48, and if these films are electrically connected to the lower surface of the semiconductor chip 2, the reverse surface potential of the semiconductor chip 2 can be easily accessed. Electrical connection between the second protective film and the semiconductor chip 2 can also be established by using a conductive bonding agent in place of bonding agent 19 applied to the lower surface of the semiconductor chip 2. Moreover, if both the first and second protective films are formed of a metal, the reliability against the permeation of water from the outside and to external forces is further improved.

What is claimed is:

1. A semiconductor device comprising:
an insulating film having an opening, opposed first and second surfaces, and a width;
a semiconductor chip positioned within the opening of said insulating film, said semiconductor chip having opposed first and second surfaces generally parallel to said first and second surfaces of said insulating film, respectively, and a plurality of electrodes disposed on said first surface of said semiconductor chip;
a plurality of leads supported on said first surface of said insulating film, each of said leads having a first end connected to a corresponding electrode of said semiconductor chip and a second end extending beyond said insulating film;
first and second protective films having respective widths substantially the same as the width of the insulating film, disposed on opposite sides of said semiconductor chip and on opposite sides of said insulating film facing said first and second surface of said insulating film, respectively; and
a bonding agent disposed between said first protective film and said first surface of said semiconductor chip, between said first protective film and said first surface of said insulating film, between said second protective film and said second surface of said semiconductor chip, and between said second protective film and said second surface of said insulating film, sealing said semiconductor chip and bonding said first and second protective films to said semiconductor chip and said insulating film.

2. A semiconductor device according to claim 1, wherein each of said first and second protective films is electrically insulating.

3. A semiconductor device according to claim 2, wherein each of said first and second protective films is flexible.

4. A semiconductor device according to claim 2 wherein each of said first and second protective films is a ceramic.

5. A semiconductor device according to claim 1 wherein at least one of said first and second protective films is a metallic material.

6. A semiconductor device according to claim 5 wherein said second protective film is a metallic material and is electrically connected to said second surface of said semiconductor chip.

7. A semiconductor device according to claim 1 wherein said insulating film includes a plurality of lead holes peripherally disposed with respect to the opening, at least one of said leads extending across one of the lead holes between said first and second ends of said lead and wherein each of said first and second protective films includes a plurality of outer lead holes formed at the same position as the outer lead holes of said insulating film.

8. A semiconductor device according to claim 7 wherein the outer lead holes of said first protective film are larger than the outer lead holes of said insulating film.

9. A semiconductor device according to claim 8 wherein each of said plurality of leads includes a test pad disposed within the outer lead holes of said first protective film, said semiconductor chip being testable through said test pads after said semiconductor chip has been sealed between said first and second protective films with said bonding agent.

10. A semiconductor device according to claim 1 wherein at least one of said first and second protective films includes a recess disposed opposite said semiconductor chip for accommodating said semiconductor chip.

* * * * *